United States Patent [19]

Hess et al.

[11] Patent Number: 4,863,755

[45] Date of Patent: Sep. 5, 1989

[54] PLASMA ENHANCED CHEMICAL VAPOR DEPOSITION OF THIN FILMS OF SILICON NITRIDE FROM CYCLIC ORGANOSILICON NITROGEN PRECURSORS

[75] Inventors: Dennis W. Hess, Walnut Creek; Todd A. Brooks, Mill Valley, both of Calif.

[73] Assignee: The Regents of the University of California, Berkeley, Calif.

[21] Appl. No.: 106,848

[22] Filed: Oct. 16, 1987

[51] Int. Cl.$^4$ .............................. B32B 9/04; B05D 5/06
[52] U.S. Cl. .......................................... 427/39; 427/38; 427/51; 427/93; 427/94; 428/448; 428/450; 437/225
[58] Field of Search ...................... 427/39, 38, 93, 51, 427/94; 428/446, 448, 450; 219/121.36

[56] References Cited

U.S. PATENT DOCUMENTS

| | | | |
|---|---|---|---|
| 3,853,567 | 12/1974 | Verbeek | 106/44 |
| 3,892,583 | 7/1975 | Winter | 106/55 |
| 4,158,717 | 6/1979 | Nelson | 428/446 |
| 4,330,569 | 5/1982 | Gulett | 427/38 |
| 4,451,969 | 6/1984 | Chaudhuri | 29/572 |
| 4,692,344 | 9/1987 | Kaganowicz et al. | 427/39 |
| 4,708,884 | 11/1987 | Chandross et al. | 427/39 |

OTHER PUBLICATIONS

K. Katoh et al., "Plasma-Enhanced Deposition of Silicon Nitride from SiH$_4$-N$_2$ Mixture," *Japanese of Journal Applied Physics*, vol. 22, #5, pp. L321-L323, (1983).

M. Gazicki et al., "Electrical Properties of Plasma Polymerized Thin Organic Films," *Plasma Chemical and Plasma Processing*, vol. 3, #3, pp. 279-327, Plenum Publishing, N.Y., (1983).

Cl Beatty, "Silicon Nitride and Silicon Carbide from Organometallic and Vapor Precursors," *Ultrastructure Processing of Ceramics, Glasses. and Composites*, Ch23, John Wiley and Sons, N.Y. (1983).

B. Arkles, "Silicon Nitride from Organosiliazane Cyclic and Linear Prepolymers," *Journal of the Electrochemical Society*, Brief Communications, pp. 233-234, Jan. 1986.

D. V. Tsu et al., "Local Atomic Structure in Thin Films of Silicon Nitride and Silicon Diimide Produced by Remote Plasma-Enhanced Chemical Vapor Deposition," *Physical Review B*, vol. 33(10), pp. 7069-7076, (1986).

V. I. Belyi, "Plasmachemical Methods for Obtaining Silicon and Boron Nitrides on Indium Antimonide," *Soviet Microelectronics*, vol. 15(2), pp. 91-94, Plenum Publishing, N.Y., (1986).

(List continued on next page.)

*Primary Examiner*—Stanley Silverman
*Attorney, Agent, or Firm*—Phillips, Moore, Lempio & Finley

[57] ABSTRACT

This invention relates to a process for the production of a solid thin film containing silicon and nitrogen on a substrate, said film having an aggregate low concentration of inorganic carbon and oxygen of less than about 51 atom percent, which process comprises:

(A) contacting the substrate with a gaseous mixture itself comprising:
  (i) a volatile cyclic organic silicon-nitrogen source, and
  (ii) a reactant independently selected from hydrogen or a hydrogen-nitrogen source, under plasma enhanced chemical vapor deposition conditions of pressure lower than 10 Torr and temperature greater than ambient temperature for a time sufficient to produce a silicon nitride thin film. In another aspect, the invention relates to the silicon-nitride thin film coated article or substrate produced by the process of the present invention. Preferred process conditions evaluates include the RF of 13.56 MHz, 20–80 W Power, power density 0.37 watts/cm$^2$ to 1.5 watts/cm$^2$ and a ratio of the silicon-nitrogen source and the hydrogen nitrogen source of between about 0.1/19.9 and 0.6/19.4 percent by volume. When ammonia is used, the aggregate concentration of carbon and oxygen is less than 20 atom percent, preferably less than 10 atomic percent.

26 Claims, 14 Drawing Sheets

OTHER PUBLICATIONS

N. Voke et al., "Optical and Electrical Properties of Hydrogenated Amorphous Silicon Nitride Films Deposited in Various PECVD Systems," *Plasma Processing*, vol. 68, pp. 175-181, Materials Research Society, Pittsburgh, (1986).

"Abstracts," (1-15 and 251-264), *Japanese Electrochemical Society*, vol. 134, #3, pp. 107C and 125C, Abstract #253, Mar. 1987.

Brooks and Hess, "Plasma-Deposited Silicon Nitride Films from Organosilicon Monomers," *Extended Abstracts*, vol. 87-1, Abstract #253, p. 365, Electrochemical Society, May 10, 1987.

J. J. Nicki et al., "Chemical Vapor Deposition in the Systems Silicon-Carbon and Silicon Carbon Nitrogen," *Journal of the Less Common Metals*, vol. 37, pp. 317-329, Netherlands, (1974).

A. M. Wrobel et al., "Mechanism of Polysilazane Thin Film Formation During Glow Discharge Polymerization of Hexamethylcyclotrisilazane," *Polymer*, vol. 17, pp. 673-677, Poland, (1976).

A. M. Wrobel et al., "Structure of Glow Discharge Polysilazane Thin Films," *Polymer*, vol. 17, pp. 678-684, Poland, (1976).

M. Gazicki et al., "Studies on Soluble Fraction of Glow Discharge Polysilazane Formed from Hexamethylcyclotrisilazane", Journal of Applied Polymer Science, vol. 21, pp. 2013-2019, Wiley & Sons, N.Y., (1977).

K. S. Mazdiyasni et al., "Characterization of Organosilicon-Infiltrated Porous Reaction-Sintered $Si_3N_4$," *Journal of American Ceramic Society*, vol. 61, #11-12, pp. 504-508, Dec. 78.

A. M. Wrobel et al., "Effect of Glow Discharge Conditions on Structure and Therman Properties of Polysilazane Thin Films," *J. Macromol Sci. Chem.*, A12(7), pp. 1041-1045, Poland, (1978).

J. Tyczkowski et al., *Thin Solid Films*, 55, pp. 253-259, Netherlands, (1978).

M. Kryszewski et al., "Plasma-Polymerized Organosilicon Thin Films-Structure and Properties," *Plasma Polymerization*, p. 219-235, American Chemical Society, Washington, D.C., (1979).

A. M. Wrobel et al., "Thermal Modification of Plasma-Polymerized Organosilanzane Thin Films," *Plasma Polymerization*, pp. 253-249, American Chemical Society, Washington, D.C., (1979).

A. M. Wrobel et al., "Polymerization of Organsilicones in Microwave Discharges. II Heated Substrates," *J. Macromal Sci. Chem.*, A15(2), pp. 197-213, (1981).

T. Hirari et al., "Preparation of Amorphous $Si_3N_4$-C Plate by Chemical Vapour Deposition," *Journal of Materials Science*, vol. 16, pp. 17-23, Chapman Hall, (1981).

T. Hirai et al., "Density and Deposition Fates of Amorphous CVD-$Si_3N_4$ Including Carbon," *Journal of Material Science*, vol. 16, pp. 2877-2882, Chapman Hall, (1981).

T. A. Brooks and D. W. Hess, (1987), "Plasma-Enhanced Chemical Vapor Disposition of Silicon Nitride from 1,1,3,3,5,5-Hexamethylcyclotrisilazane and Ammonia," *Thin Solid Films*, vol. 153, pp. 521-529.

T. A. Brooks and D. W. Hess, "Deposition Chemistry and Structure of Plasma-Deposited Silicon Nitride Film from 1,1,3,3,5,-Hexamethylcyclotrisilanzane," *Journal of Applied Physics*, vol. 64, #2, pp. 841-848, (Jul. 15, 1988).

FIG._1

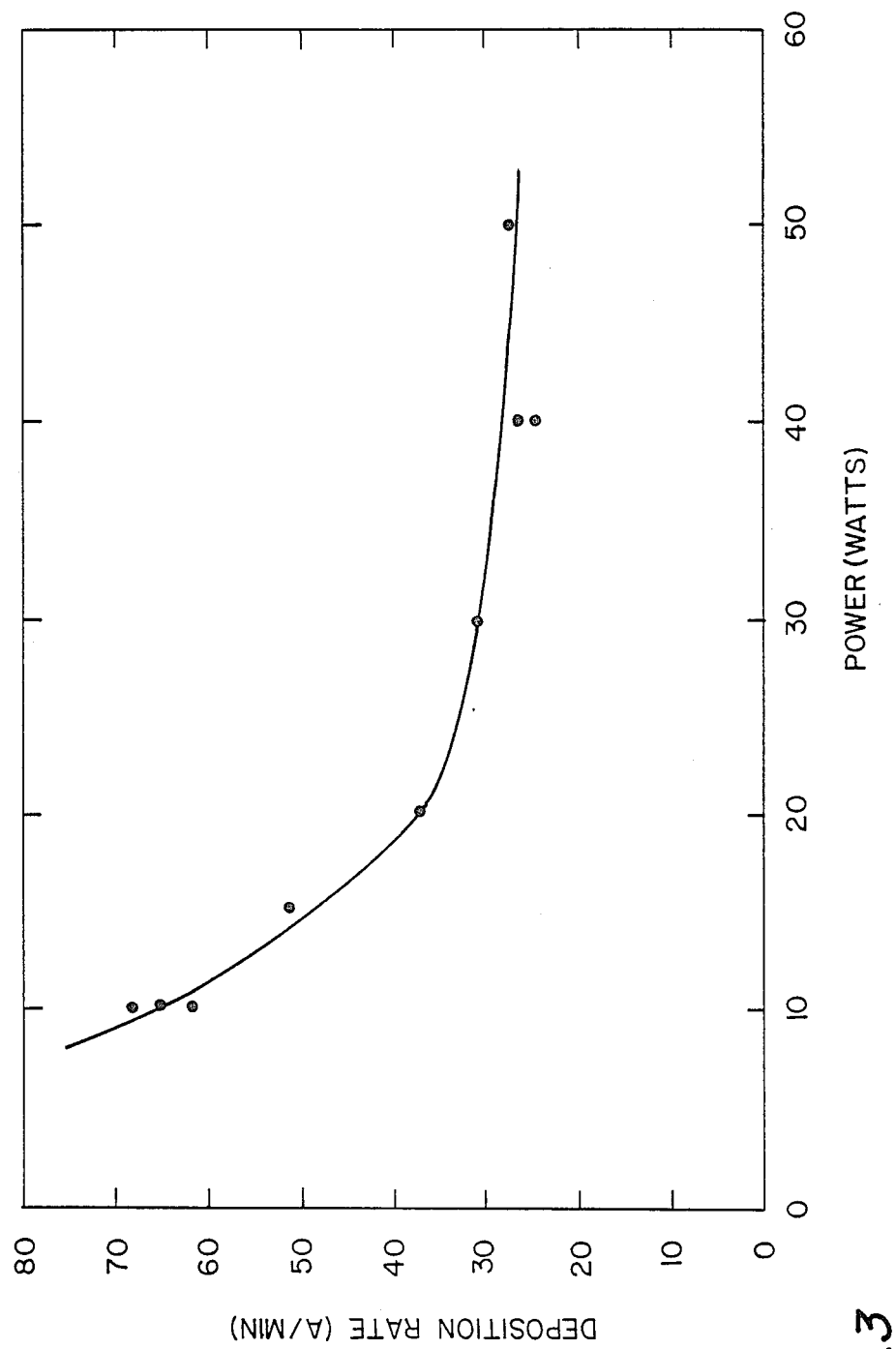
FIG._3

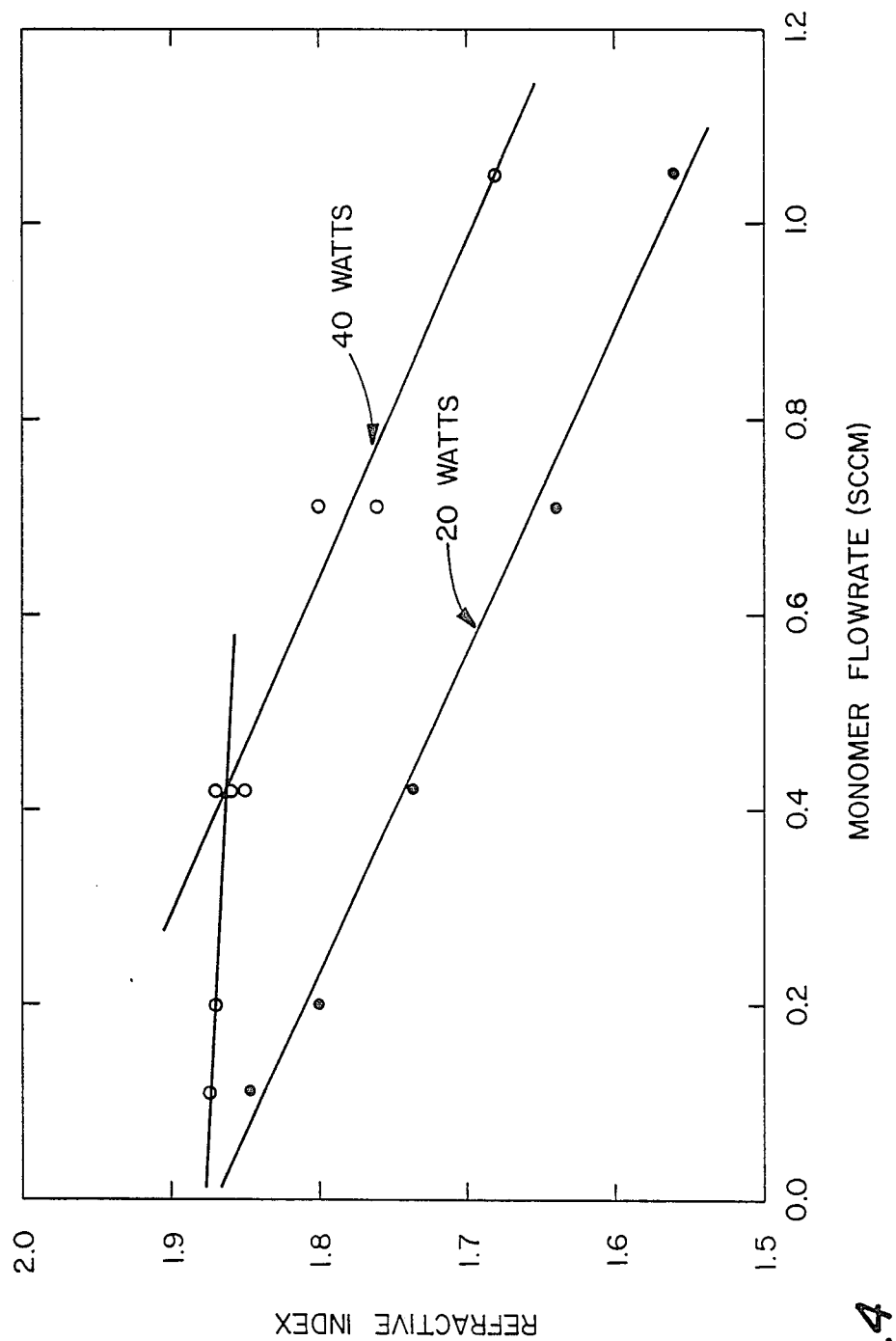
FIG._4

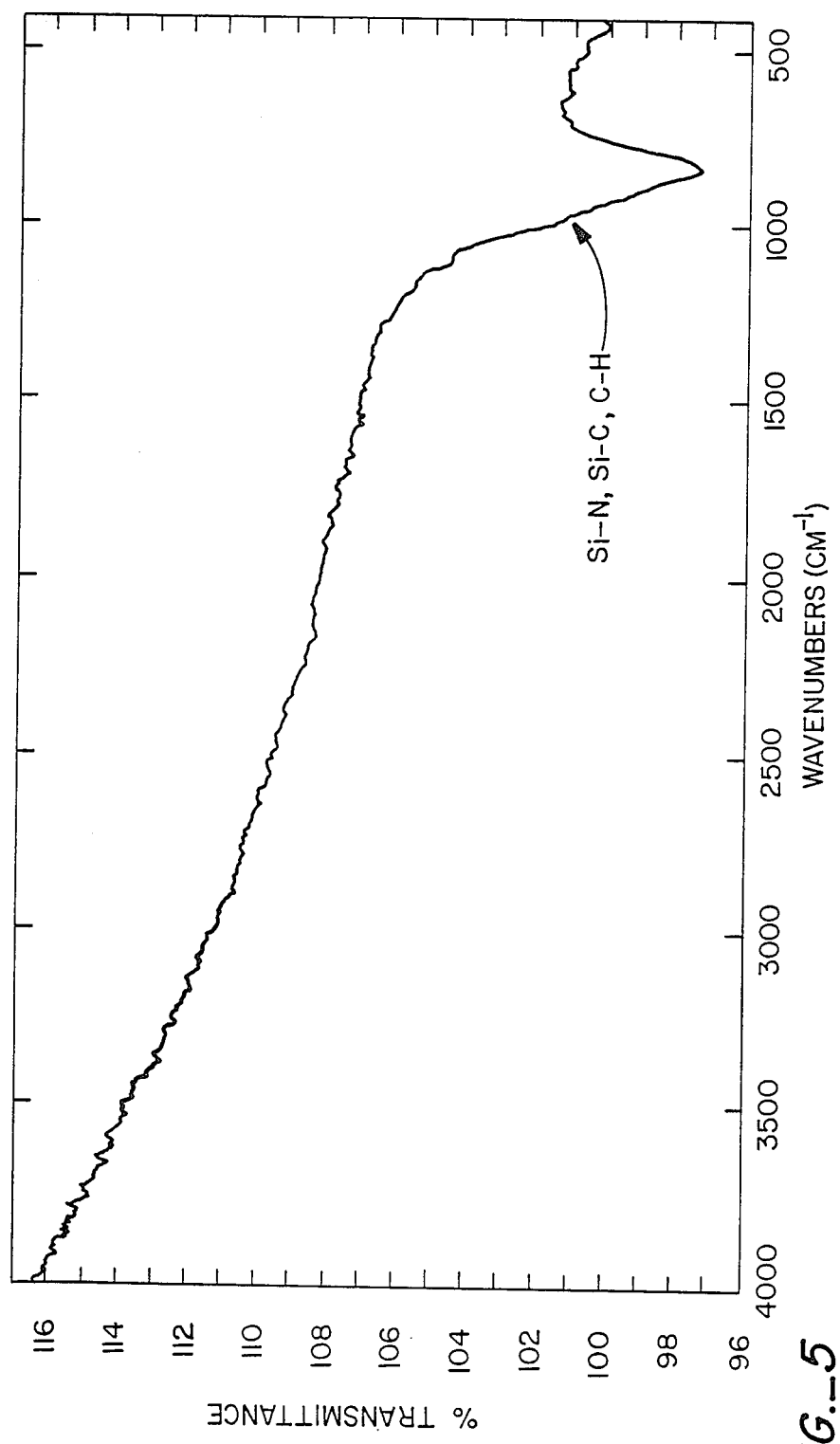
FIG.—5

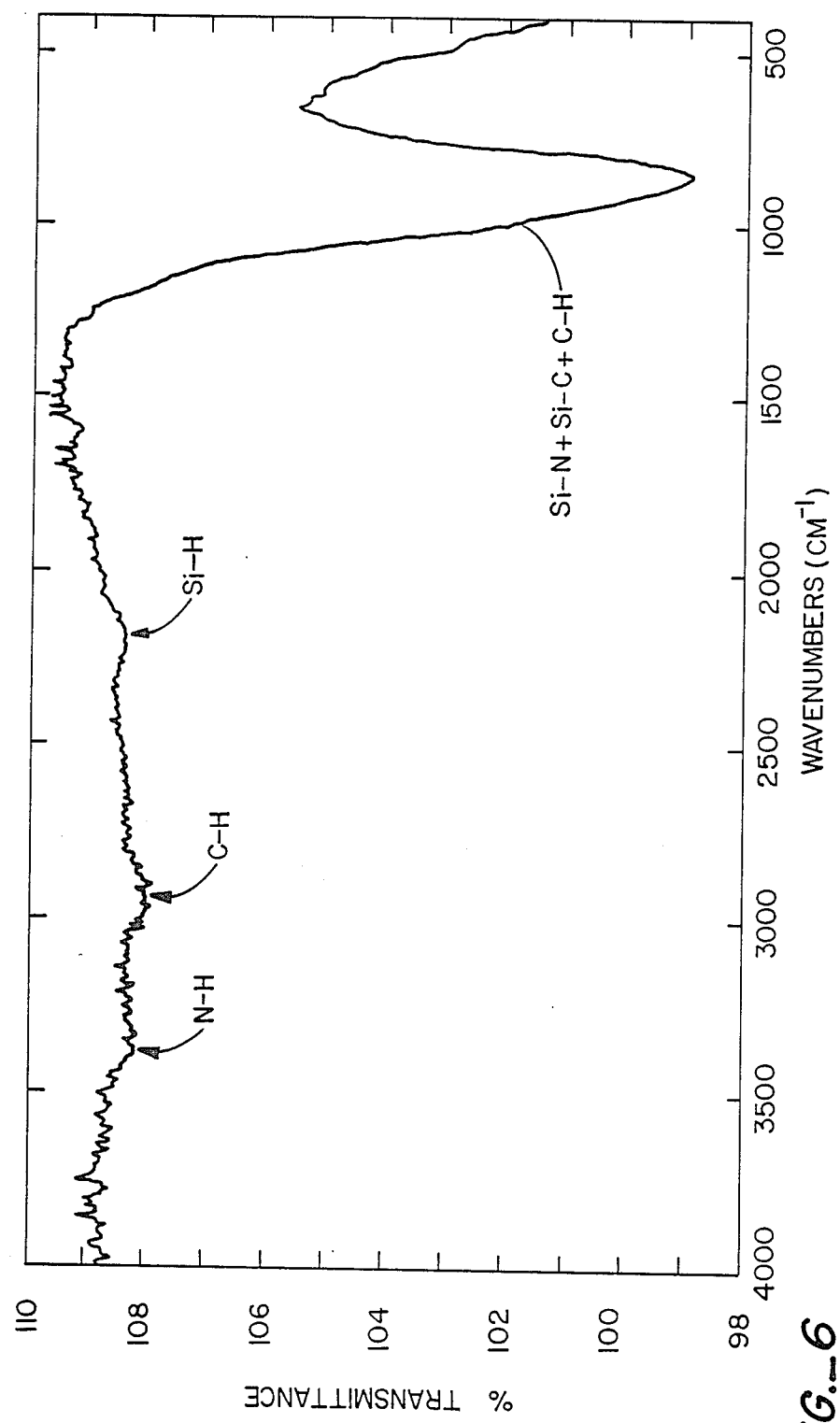
FIG._6

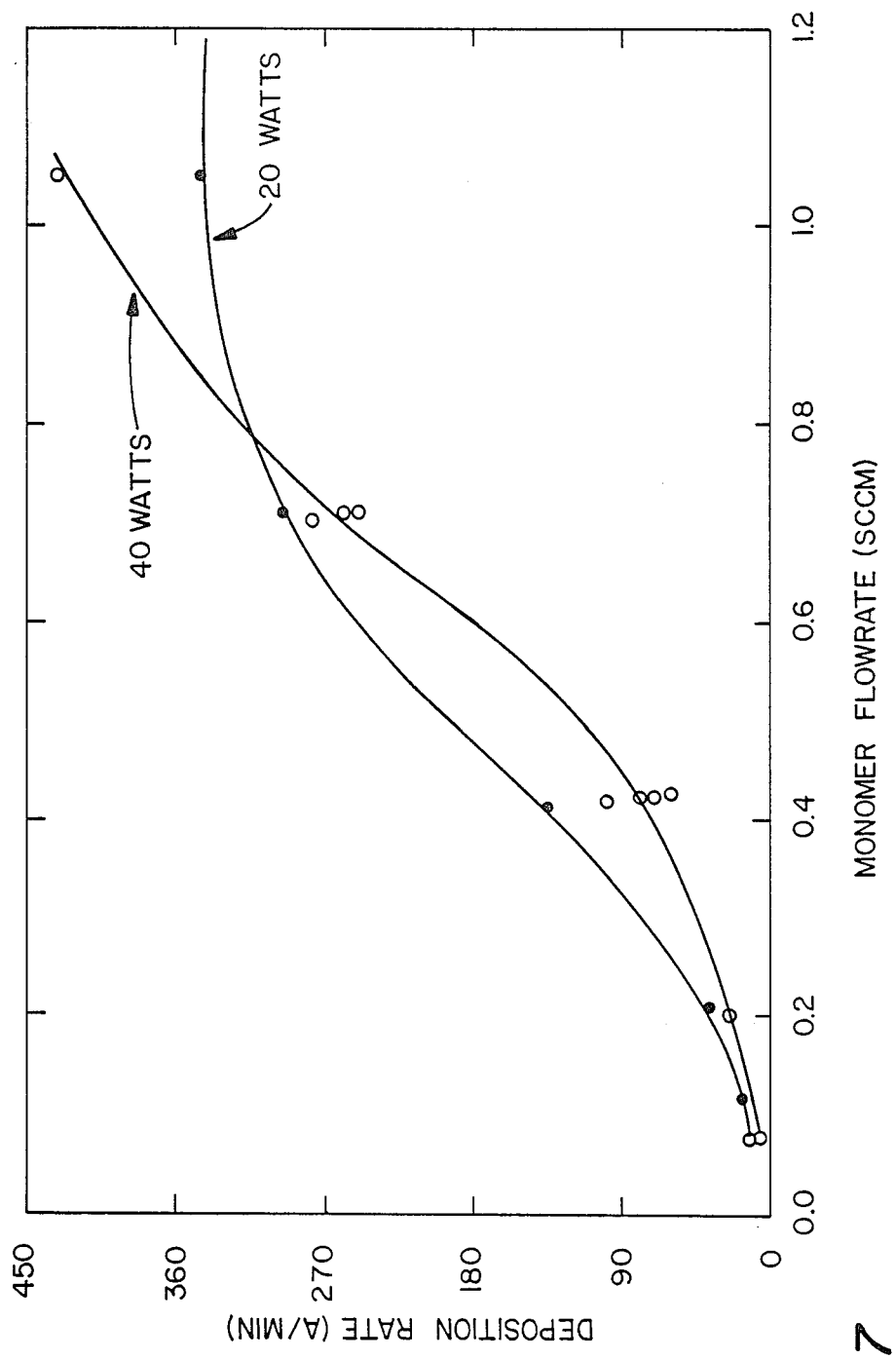
FIG._7

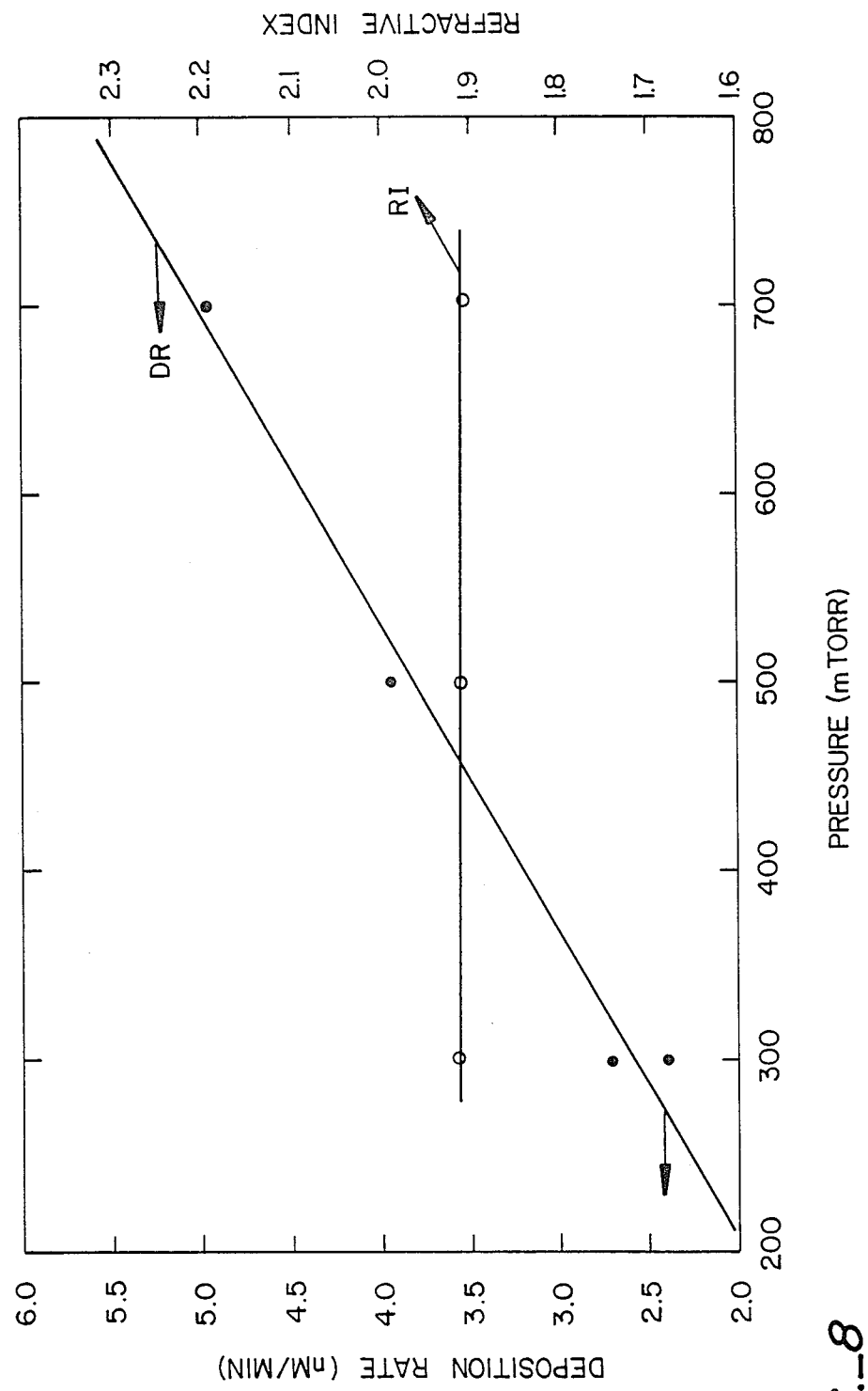
FIG._8

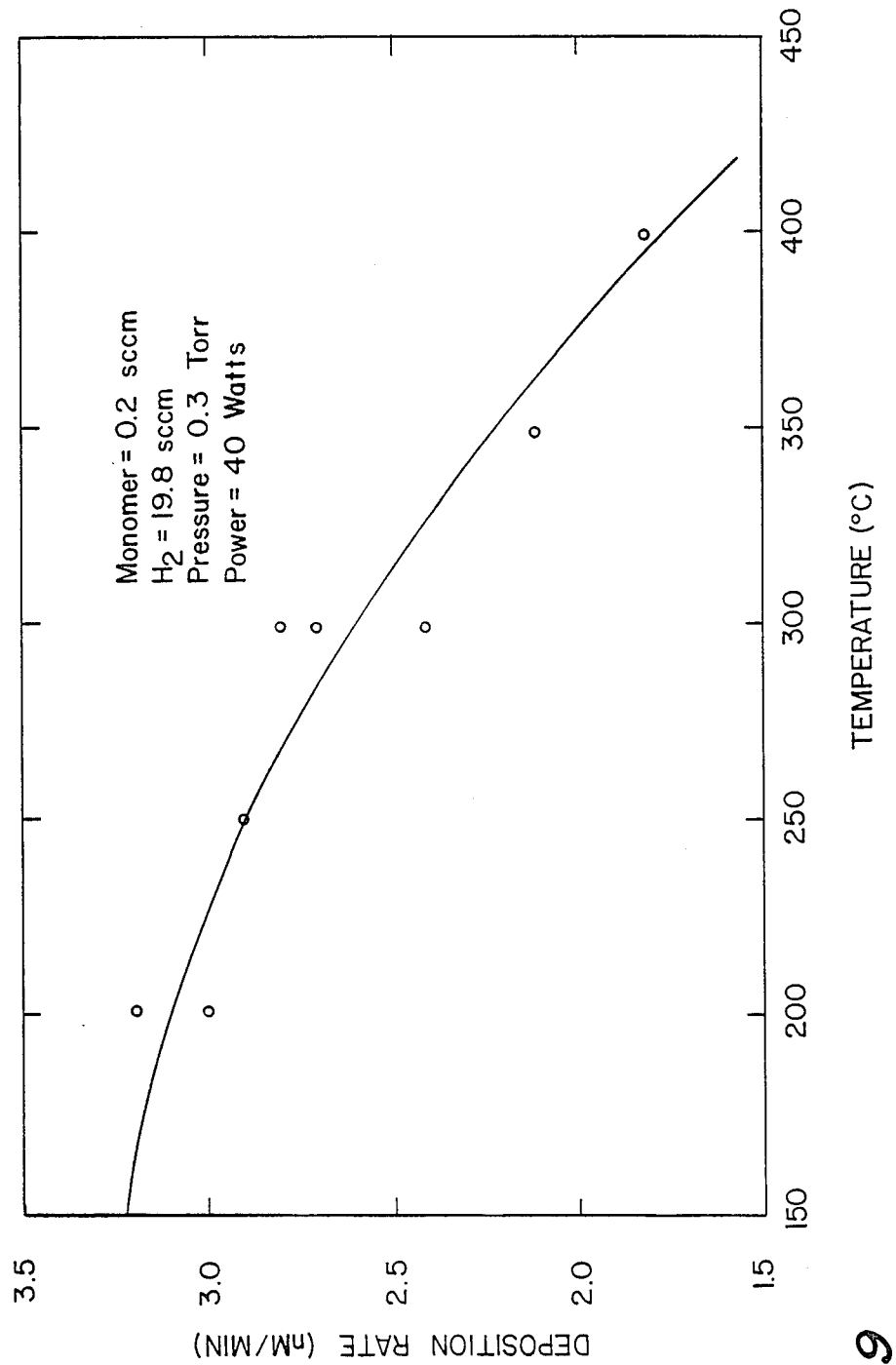
FIG._9

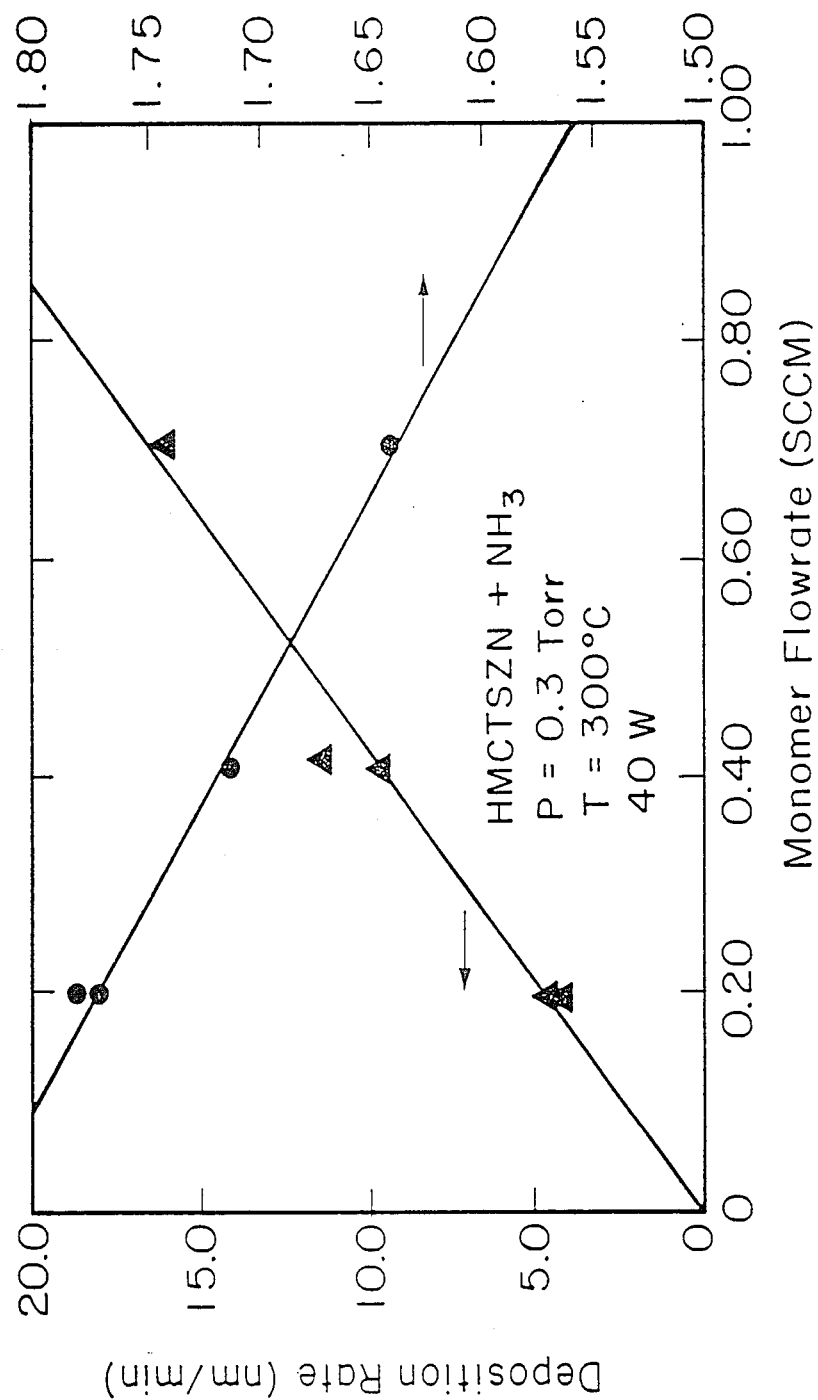
FIG._10

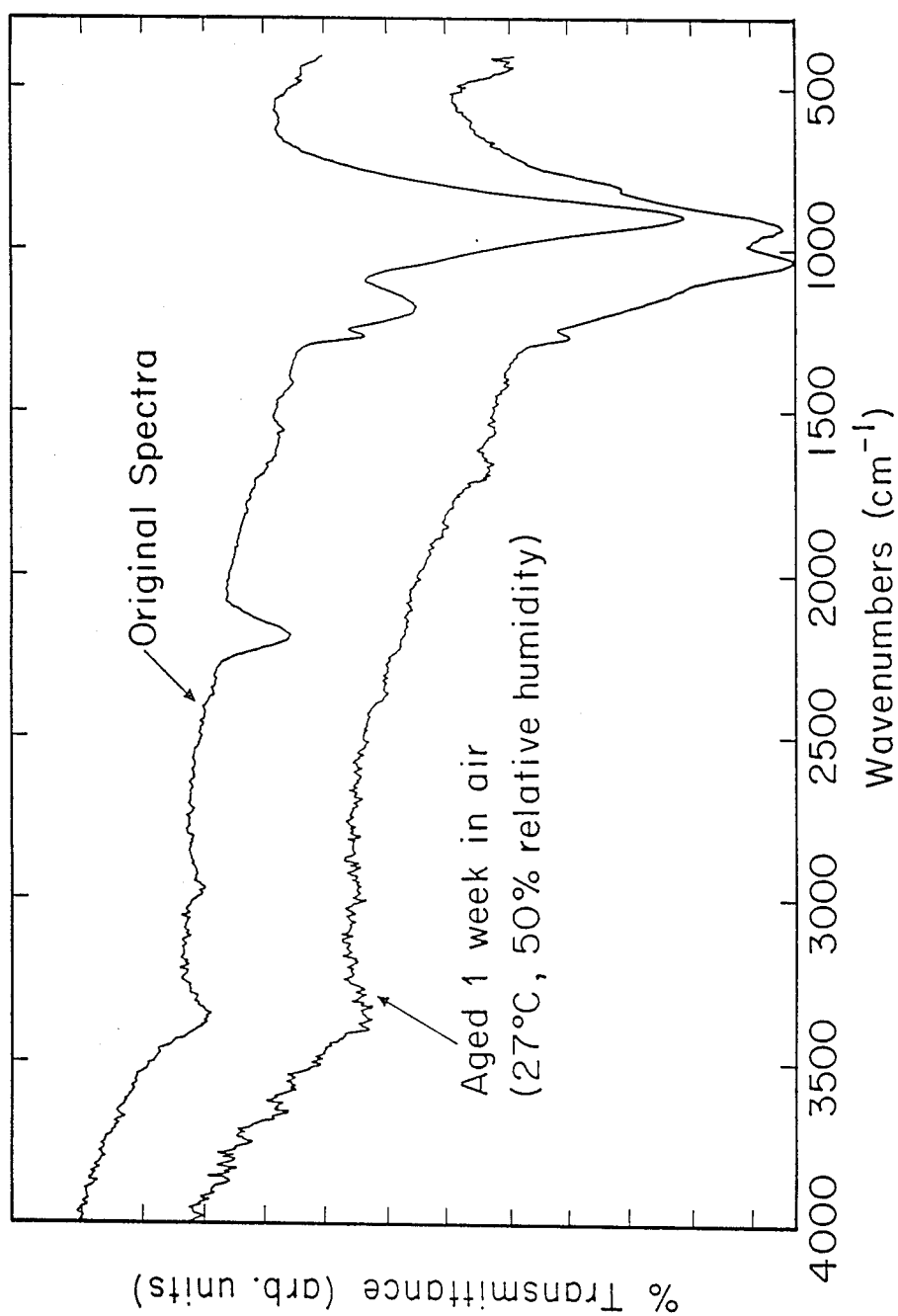
FIG._11

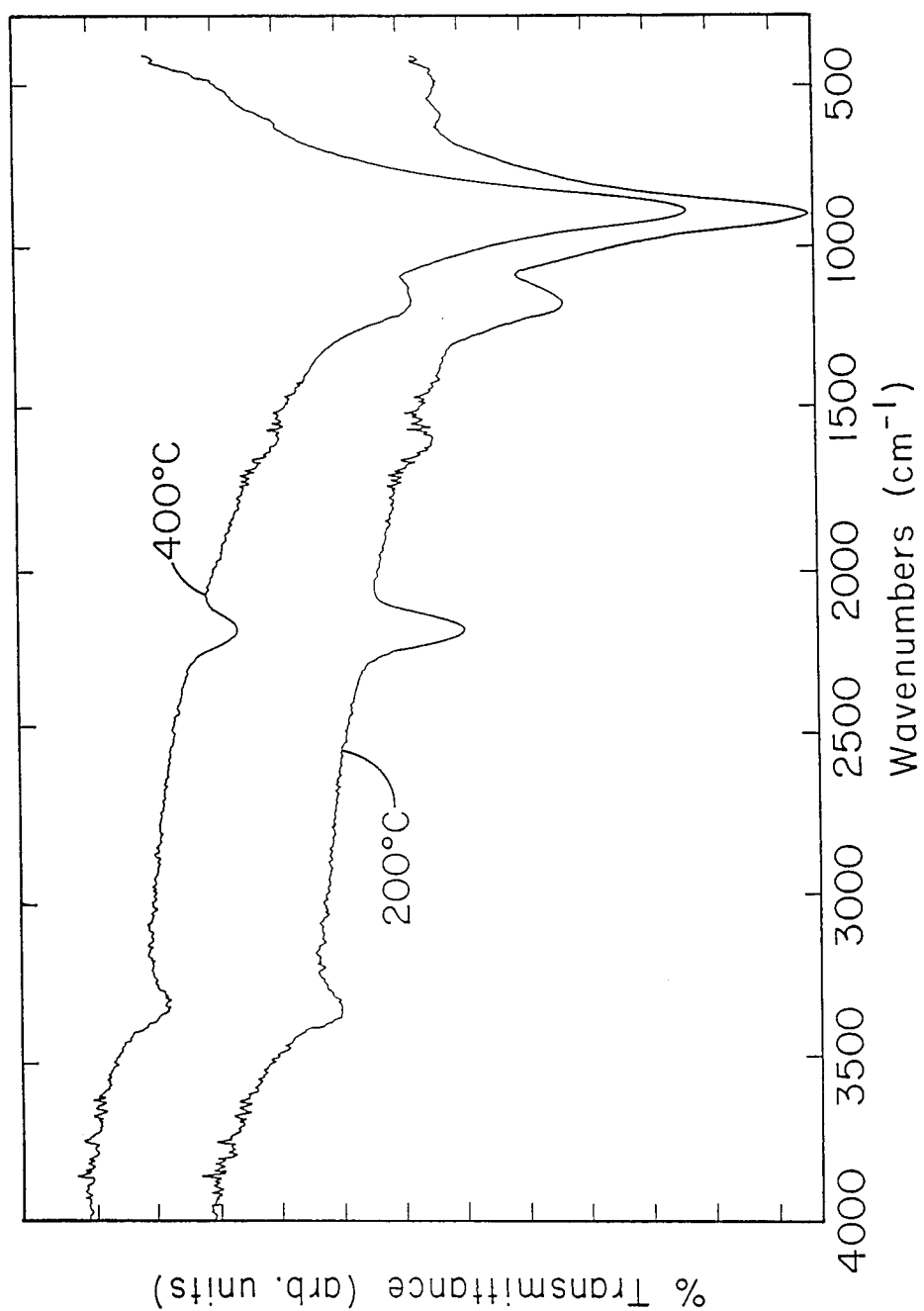
FIG._12

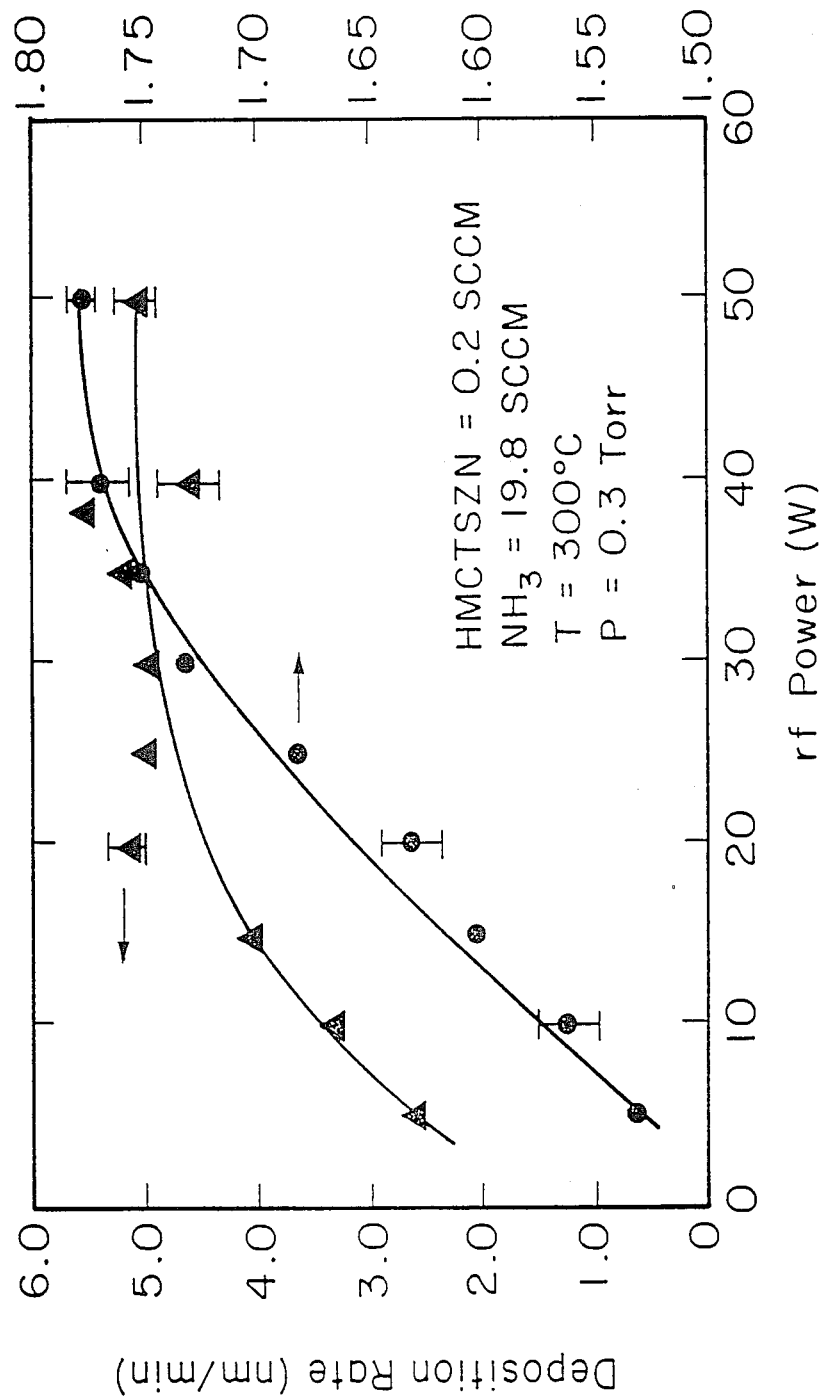
FIG._13

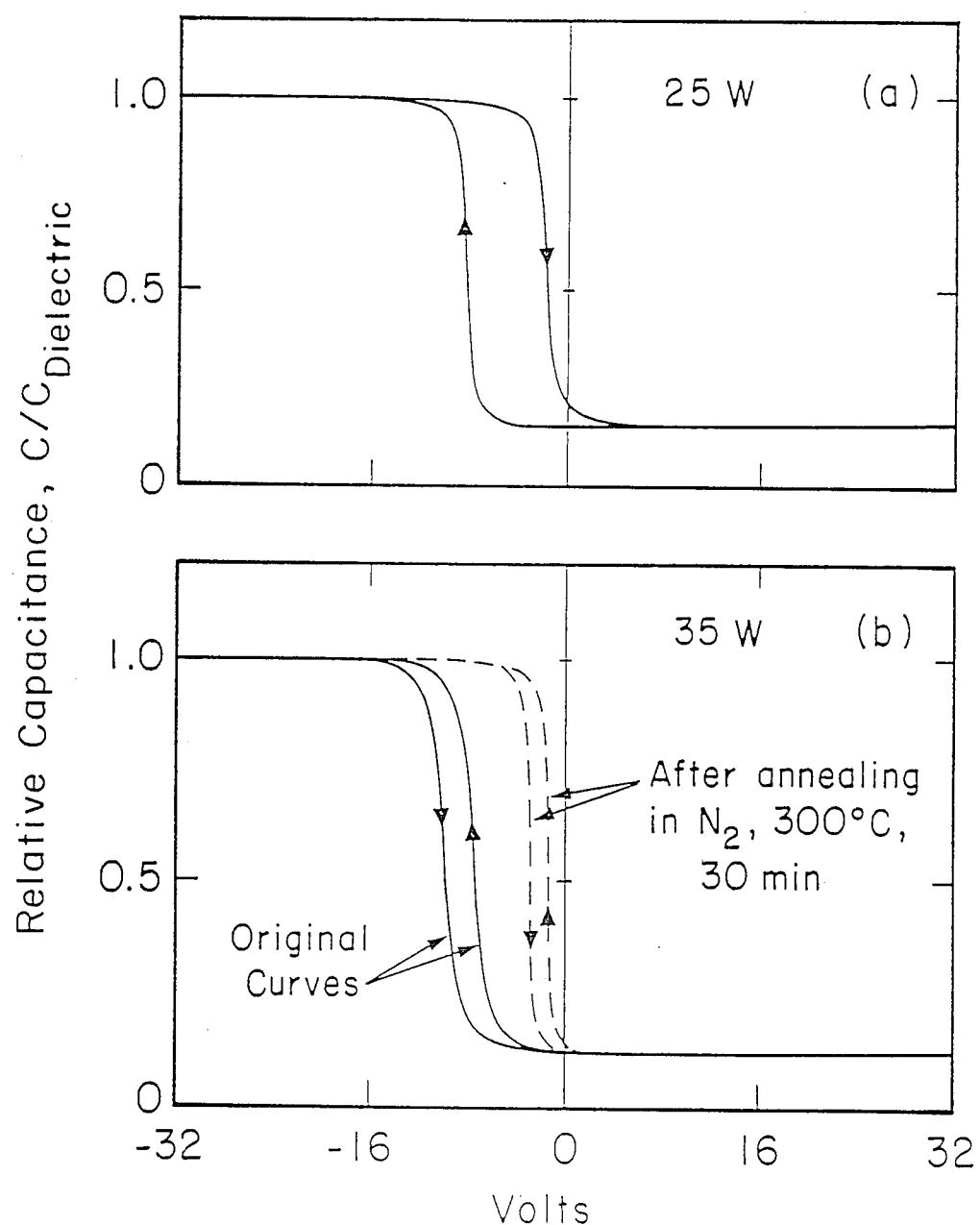
FIG._14

PLASMA ENHANCED CHEMICAL VAPOR DEPOSITION OF THIN FILMS OF SILICON NITRIDE FROM CYCLIC ORGANOSILICON NITROGEN PRECURSORS

ORIGIN OF THE INVENTION

This invention resulted from research supported, in part, by the National Science Foundation under Grant No. MSM-86 11473. The U.S. Government has certain rights in parts of this invention pursuant to Public Law 96-517 (and subsequent amendments).

BACKGROUND OF THE INVENTION

1. Field of the Invention

The present invention relates to a method for producing thin films of silicon nitride. More specifically, the present invention relates to a method of producing a thin film of silicon ceramic-like nitride on an object by subjecting a vapor of a cyclic silicon-nitrogen precursor, such as 1,1,3,3,5,5-hexamethylcyclotrisilazane, with hydrogen alone or a source of hydrogen and nitrogen, such as ammonia. These thin films do not require the usual post-deposition pyrolysis at 800° C. or higher, and are useful as passivation coatings on objects, such as semiconductor inter metal dielectric layers.

2. Description of the Related Art

Plasma enhanced chemical vapor deposition (PECVD) of silicon nitride ($SiN_xH_y$, where x is between about 0.8 and 1.5 and y is between about 0.4 and 1.2) are used as final passivation layers in microelectronic circuits. Silicon nitride is preferred due to its impermeability to water and to sodium ion diffusion as well as mechanical toughness and high dielectric constant.

In the past, typical methods for film production involve the plasma enhanced reaction of silane ($SiH_4$) with either nitrogen ($N_2$) or ammonia ($NH_3$). The difficulties encountered in the control of $SiN_xH_y$ stoichiometry along with the pyrophoric nature of silane has lead to the investigation of organosilicon monomers as sources of silicon for $SiN_xH_y$ thin film formation.

In U.S. Pat. No. 4,158,717, N. H. Nelson discloses a preparation of a silicon nitride film by the plasma discharge of a vapor of azidotrimethylsilane. Temperatures between 100°–400° C. and a pressure of 0.15 to 0.20 Torr were used.

M. R. Gulett et al., in U.S. Pat. No. 4,330,569 disclose a method of conditioning a nitride surface.

J. Janca et al., in *Acta Phys. Slov.*, Vol. 33 (#3), pp. 187–193, published in 1983 disclose the preparation of thin silicon nitride films which are deposited in the RF discharge plasma of 1.5 MHz of vaporizable linear hexamethyldisilazane [$(CH_3)_3Si]_2NH$, or azidotrimethylsilane $(CH_3)_3SiN_3$ in the presence of nitrogen.

V. I. Belyi et al., in *Mikroelectronica* (Akad.Nauk SSSR), Vol. 15, p. 146–149 (1986) [see *Soviet Microelectronics*, Vol. 15, No. 2, p. 91–94 (1986)], disclose the plasma polymerization of hexamethylcyclotrisilazane at 0.1 $W/cm^2$ (RF) in ammonia. The film produced showed large Si-H and N-H peaks by infrared spectral analysis, as well as substantial Si-C and C-H absorptions.

D. V. Tsu et al., in *Physical Review B*;, Vol. 33 (#10), pp. 7069 to 7076, published in 1986, disclose the preparation of silicon nitride thin films by remote plasma-enhanced chemical vapor deposition using gas mixtures of silane and either nitrogen or ammonia.

B. Arkles in the *Journal of the Electrochemical Society*, pp. 233–234, published in January, 1986, discloses that silicon nitride is formed from cyclic and linear organosilazane prepolymers as single components. The materials are pyrolyzed at temperatures of 350° C. or greater. Complete conversion to ceramic occurs at temperatures exceeding 700° C.

A. M. Wrobel in the *Journal of Macromolecular Science-Chemistry*, Vol. A15 (#2), pp. 197–213, published in 1981, disclose the polymerization of hexamethyltrisilazane as a single component in a microwave plasma at 2.45 gigahertz (GHz). The polymerizations to provide thin polysilazane films were conducted at substrate temperatures of 25°, 200°, 400°, 600° and 800° C.

A. M. Wrobel et al., disclose in *Polymer*, Vol. 17, pp. 673–677 and 678–684, published in 1986, the prepartion of thin polysilazane films by the glow discharge polymerization of hexamethylcyclotrisilazane as a single component at 20 kHz.

A. M. Wrobel et al., in *Plasma Polymerization* (M. Shen and A. T. Bell, eds.) American Chemical Society Symposium Services, No. 108, ACS, Washington, D.C., pp. 237–249, published in 1979, disclose the plasma polymerization of hexamethylcyclotrisilazane in a glow discharge at 20 kilohertz (kHz). A combination of the monomer and ammonia at 0.3 Torr were used in one example. Considerable organic character is present. Pyrolysis of the layer at 600° and 800° C. showed a loss of Si-C bonds, formation of methane, and increasing inorganic ceramic character.

M. Kryszewski et al., in *Plasma Polymerization* (M. Shen and A. T. Bell, eds.) American Chemical Society Symposium Series, No. 108, ACS, Washington, D.C., Chapter 13, pp. 219–235, published in 1979, disclose the plasma polymerization of hexamethylcyclotrisilazane vapor under glow discharge conditions of 20 kilohertz (kHz). Upon pyrolysis of the thin films at a RF value of 13.5 MHz in a glow discharge, cyclic SiN compounds were evolved.

J. Tyczkowski et al., in *Thin Solid Films*, Vol. 55, pp 253–259, published in 1978, disclose the production of polysilazane films by the hexamethylcyclotrisilazane as a single component in a glow discharge at 20 kHz.

M. Gazicki et al., in *Plasma Chemistry and Plasma Processing*, Vol. 3, (No. 3), pp. 279–327, published in 1983, disclose the glow discharge plasma polymerization of hexamethylcyclotrisilazane under glow discharge conditions.

M. Gazicki et al., in the *Journal of Applied Polymer Science*, Vol. 21, pp. 2031–2019, published in 1977, disclose the glow discharge polymerization at 20 kHz of hexamethylcyclotrisilazane as a single component to produce polysilazane as a thin film.

N. Voke et al. *Materials Research Society Symposia Proceedings* (Symposium held in Palo Alto, Calif., U.S.A., Apr. 15–18, 1986), Vol. 68, pp. 175–181, published in Pittsburgh, Pa. in 1986, disclose the plasma enhanced chemical vapor deposition of silicon-nitride thin films under different experimental conditions using silane and ammonia.

W. Verbeek in U.S. Pat. No. 3,853,567 and G. W. Winter, et al., in U.S. Pat. No. 3,892,583 disclose a method of making a shaped article of silicon carbide and nitride of silicon carbide and nitride by decomposing a silazane at about 200° to 800° C.

T. H. Hirai et al., in the *Journal of Materials Science*, Vol. 16, pg. 17-29 and also on pp. 2877-2882, published in 1981 disclose the deposition of CVD-$S_3N_4$ layers including carbon.

J. J. Nicki et al., in the *Journal of Less-Common Metals*, Vol. 37, pg. 317-329, published in 1974, disclose the CVD of layers of Si-C and Si-C-N.

C. L. Beaty in "Silicon Nitride and Silicon Carbide from Organometallic and Vapor Precursors", Chapter 3 in *Ultrastructure Processing of Ceramics, Glasses and Composites*, edited by L. L. Hench, John Wiley and Sons, New York, N.Y., published in 1984 disclose a number of methods of preparation of silicon nitride.

E. J. Charlson et al., in "Electrical Properties of Glow Discharge Polymerized Films", in *Organic Coatings and Applied Polymer Science Proceedings*, Vol. 47, pg. 146-150, American Chemical Society, Washington, D.C., published in 1982 disclose some methods of preparing polymerized Si-N films. S. K. Varshney at al., "Surface Structure and Properties of R.F. Plasma Polymerized Hexamethyldisilazane", in the same volume pg. 151-153 disclose the properties of glow discharge produced polymer films from hexamethyldisilazane.

S. K. Varshney et al., "Plasma Polymerization of Silanes", in *Organic Coatings and Applied Polymer Sciences Proceedings*, Vol. 46, pg. 127-133, American Chemical Society, Washington, D.C. 20036 disclose the results of plasma polymerization of silanes.

K. S. Mazdiyasni et al., in *The Journal of the American Ceramic Society*, Vol. 61, Nos. 11-12, pg. 504-508, published in 1978 disclose the characterization of organosilicon-infiltrated porous reaction sintered $Si_3N_4$.

A. M. Wrobel et al., *Journal of Macromolecular Science-Chemistry*, Vol. A12, No. 7, pg. 1041-1054, published in 1978 disclose the effect of glow discharge conditions or structure and thermal properties of polysilazane thin films. The films were produced by glow discharge polymerization of hexamethylcyclotrisilazane with various gases: argon, nitrogen, hydrogen and ammonia. The polymer films produced with hydrogen and ammonia under these conditions had considerable organic carbon, (C-H stretches) content. A post deposition pyrolysis of the film is described to obtain specific physical properties.

If the cyclic intermediate is polymerized normally, as in a normal plasma, a porous silicon nitride thin film having —$CH_3$ groups is obtained. The film is porous to alkali ions and is not dense because the polymeric molecules are not closely packed. The film is not a good chemical barrier because of the porosity. To obtain the desired porosity, it is necessary to pyrolyze the film to 1000° C. or higher to form silicon and carbon radicals which crosslink and produce a film having the desired high density (d=1.8 to 2.1) and low porosity. These temperatures normally damage or destroy other films or substrates present in microelectronic devices, and are to be avoided if at all possible.

A major problem encountered in most of the methods of the above cited art is the use of $SiH_4$ as a silicon precursor. $SiH_4$ is a dangerous, pyrophoric material to use under laboratory or industrial conditions. None of the above articles or patents individually or collectively in any fashion teach, disclose or suggest the present invention. It is therefore very useful to have a PECVD process to deposit a thin layer of silicon nitride having a minimum of carbon, oxygen, and/or hydrogen on a substrate under mild reaction and substrate conditions, and without the need for post-deposition pyrolysis to reduce the organic nature of the films to form a stable ceramic film.

SUMMARY OF THE INVENTION

The present invention relates to a process for the production of a solid thin film containing silicon and nitrogen on a substrate, said film having a aggregate low concentration of carbon and oxygen of less than 51 atom percent, which process comprises:

(A) contacting the substrate with a gaseous mixture itself comprising:
  (i) a volatile cyclic organic silicon/nitrogen source, and
  (ii) a reactant independently selected from hydrogen alone or from a hydrogen/nitrogen source, under plasma enhanced chemical vapor deposition conditions of pressure lower than 10 Torr and temperature greater than ambient temperature for a time sufficient to produce a silicon nitride thin film.

When ammonia only is used in subpart (ii), the carbon and oxygen content is less than 20 atom percent, in a preferred embodiment.

A prefered embodiment is the process wherein the ratio of the volatile cyclic organic silicon/nitrogen source (i) to the hydrogen source (ii) is betweeen about 0.1/19.9 and 0.6/19.4 percent by volume.

In a separate aspect, the present invention relates to the process wherein in step (a), subpart (ii), the reactant is selected from hydrogen gas or ammonia.

In another additional aspect, the present invention relates to a process for the production of a solid thin film containing silicon and nitrogen on a substrate said film having an aggregate low concentration of carbon or oxygen of less than 10 atom percent, which process comprises:

(a) contacting the substrate with a gaseous mixture itself comprising:
  (i) 1,1,3,3,5,5-hexamethylcyclotrisilazane, 1,2,3,4,5,6-hexamethylcyclotrisilazane, 1,1,3,3,5,5,7,7-octamethyl cyclotetrasilazane, 1,2,3,4,5,6,7,8-octamethylcyclotetrasilazane, or mixtures thereof, and
  (ii) hydrogen, nitrogen, ammonia, hydrazine or mixtures thereof, wherein (i) and (ii) are in a ratio of between about 0.1/19.9 and 0.4/19.6 by volume, (b) producing an enhanced plasma discharge in the gaseous mixture under conditions to produce chemical vapor deposition on said substrate of a thin film of silicon nitride having an aggregate low concentration of carbon and oxygen of less than 10 atom percent, wherein said conditions comprise temperatures of between about 200° and 400° C., pressures of between about 0.2 and 0.7 Torr and a power density of between about 0.4 and 1.2 watts per $cm^2$; and (c) recovering the silicon-nitrogen thin film coated substrate.

In another aspect, the present invention relates to an article or substrate having a silicon-nitrogen thin layer which is produced by the process described herein.

BRIEF DESCRIPTION OF THE FIGURES

FIGS. 1-9 relate to cyclic monomer and hydrogen.

FIG. 1 describes a schematic diagram of the electrical components and deposition configuration of the materials for the plasma enhanced chemical vapor deposition of the present invention.

FIG. 2 shows a graph of the refractive index of the silazane layer produced using cyclic monomer and hydrogen as a function of the plasma power.

FIG. 3 shows a graph of the deposition rate of the polysilazane film as a function of the power for the monomer and hydrogen reaction.

FIG. 4 shows a graph of the refractive index of the coating as a function of the cyclic monomer flow rate at 20 W and 40 W of power in the presence of hydrogen.

FIG. 5 is a FTIR spectrum of the silazane polymer coating produced by the reaction of the cyclic monomer and hydrogen at 40 watts.

FIG. 6 is an FTIR spectrum of the silicon nitride film produced using cyclic monomer and hydrogen at 20 watts. This is not an optimum film.

FIG. 7 is a comparison of the deposition rate of the silicon nitride polymer film versus the cyclic monomer flow rate in the hydrogen system at 20 watts of power (●) and 40 watts of power (0).

FIG. 8 is a graph of the deposition rate (●) versus the pressure within the reaction system for the cyclic monomer and hydrogen. The refractive index (0) of the film remains fairly stable.

FIG. 9 is a graph of the deposition rate versus the temperature of the substrate for the cyclic monomer and hydrogen system.

FIGS. 10-14 relate to the cyclic monomer and ammonia system.

FIG. 10 shows the deposition rate (▲) and refractive index (●) vs. flowrate for cyclic monomer and ammonia, where the total flowrate is 20.0 sccm (cubic centimeters per minute at standard temperature and pressure).

FIG. 11 shows FTIR spectra of as-deposited and aged films produced at 0.7 sccm 1,1,3,3,5,5-hexamethylcyclotrisilazane (HMCTSZN), 19.3 sccm $NH_3$, 300° C., 0.3 Torr, 40 W. The film thickness is 128 nm.

FIG. 12 shows FTIR spectra of about 100 nm SiN film deposited at 200° C. and 400° C., 0.2 sccm HMCTSZN, 19.8 sccm $NH_3$, 0.3 Torr, 40 W.

FIG. 13 shows the deposition rate (▲) of SiN and refractive index (●) vs. RF power.

FIG. 14 shows typical CV plots for about 100 nm films of SiN deposited at 25 W and 35 W, on p-type silicon. The solid traces represent as-deposited films, and the dashed trace represents the result of annealing the 35 W film. Other deposition conditions are: 0.2 sccm HMCTSZN, 19.8 sccm $NH_3$, 300° C., 0.3 Torr.

DETAILED DESCRIPTION OF THE INVENTION AND PREFERRED EMBODIMENTS

Definitions

As used herein:

"HMCTSZN" refers to the cyclic monomer 1,1,3,3,5,5-hexamethylcyclotrisilazane (cyclic monomer).

"Hydrogen" or "hydrogen source" refers to hydrogen as a gas.

"Hydrogen-nitrogen source" refers to ammonia, hydrogen, nitrogen, ammonia, hydrazine or mixtures thereof.

"sccm" refers to cubic centimeters per minute at standard temperature (0° C.) and standard pressure (760 mm of Hg).

"Silicon-nitrogen source" refers to organic cyclic silicon nitrogen having 6, 8 or 10 atom cyclic rings. The organic groups, methyl, ethyl, vinyl, phenyl are at-tached to the ring structure to produce a stable volatile molecule.

EXPERIMENTAL DETAILS (Cyclic Monomer and Hydrogen Gas)

Figure 1:
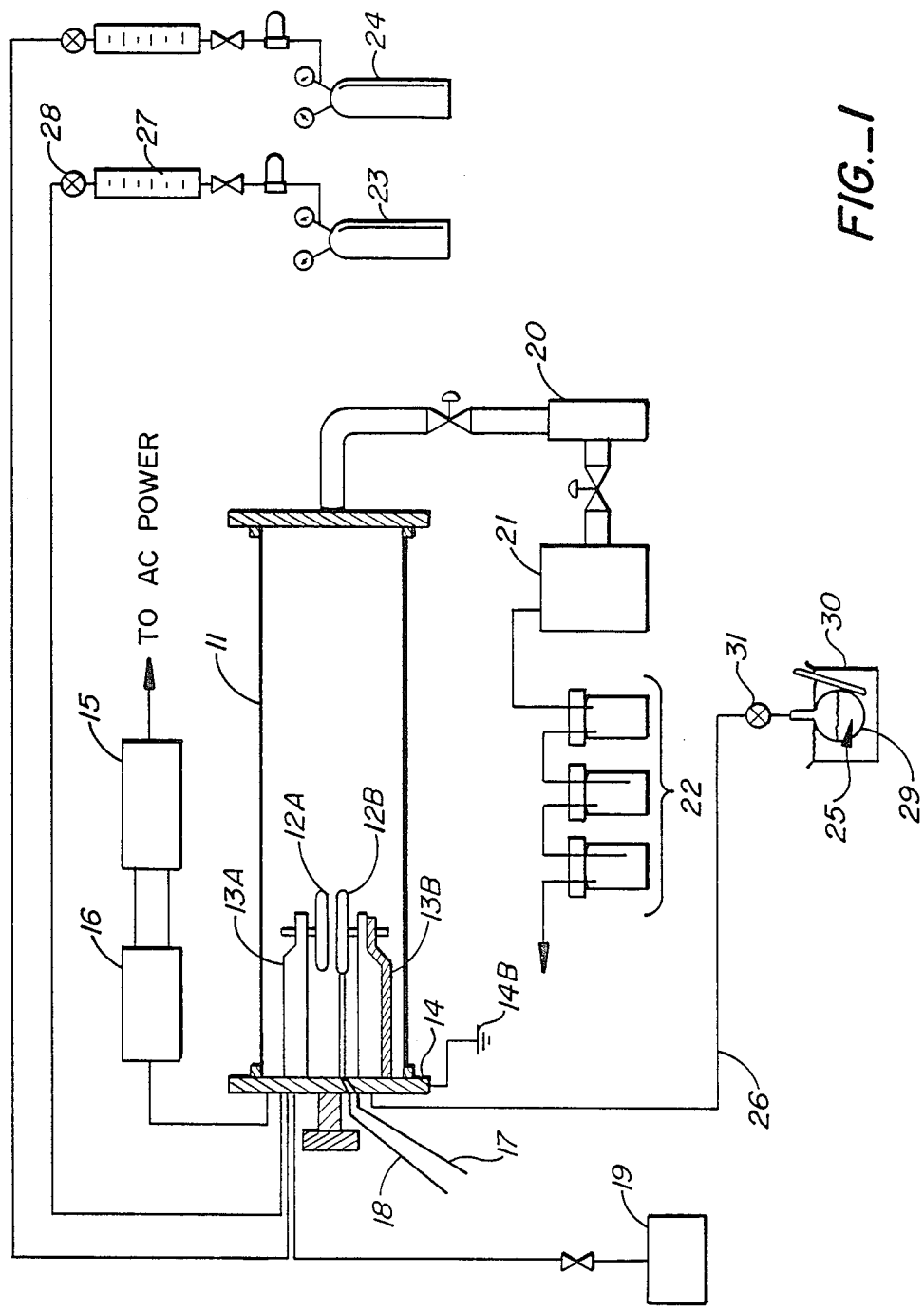

The plasma polymerized $SiN_xH_y$ films in the present study were deposited on p-type silicon substrates in a quartz, axial flow, capacitively coupled reactor as described in FIG. 1. The current reactor consists of a quartz tube 11 that is 15 cm in diameter and 60 cm long. Two stainless steel parallel plate electrodes 12A and 12B are suspended by macor insulating supports 13A and 13B from the upstream stainless steel reactor end plate 14. Electrodes 12A and 12B are circular with an 8.3 cm diameter, and have a 2.3 cm electrode gap. The upper electrode 12A is powered by an ENI (Model HF-300) 13.56 MHz rf generator 15 using a Heathkit (model 5A-2060A) matching network 16. The lower electrode 12B, upon which the substrates were placed, is grounded 16, and is heated by resistance (cartridge) heaters 17. A thermocouple 18 imbedded in this electrode is used to monitor temperature. Pressure is measured with a capacitance manometer 19, while the system is evacuated through a liquid nitrogen cold trap 20, by a 50 cfm corrosion-resistant mechanical pump 21. Prior to venting, exhaust gasses are scrubbed by a series of bubblers 22 filled with bleach and water. Electronic grade hydrogen 23 (and optionally nitrogen 24) and 1,1,3,5,5-HMCTSZN monomer 25 are introduced axially via line 26 into the reactor and flow is directed to the center of the electrode gap. $H_2$ is regulated by a rotameter 27 and needle valve 28. HMCTSZN 25 is contained in a PYREX flask 27 placed in a constant temperature mineral oil bath 30 is maintained at about 39° C., to increase monomer vapor pressure (BP=186.0° C.≈1 atm). This reactant flows into the reactor through a stainless steel delivery line 26 and calibrated metering valve 31, which are heated to 50° C. to prevent vapor condensation.

Prior to deposition, a ten minute preclean of the reactor 11 is performed using a hydrogen 23 charge to ensure minimal oxygen or water vapor contamination on the walls. The discharge is then extinguished, and the monomer is added. The system in reactor 11 is equilibrated at 0.3 Torr for twenty minutes prior to the actual SiN deposition to assure constant and steady flow rates. In all experiments performed, the reactor pressure is between about 0.1 and 1 Torr, preferably about 0.3 Torr. Substrate temperatures vary from between about 200° C.–400° C., preferably between about 300° and 400° C., while total reactant gas flow rates are maintained at 20 sccm. The average HMCTSZN flow rate is about 0.2 sccm unless otherwise stated, with the remainder of the total flow being hydrogen source. Upon completion of the deposition, all films are cooled to 100° C. under nitrogen, at 1 Torr, prior to exposure to the atmosphere. The power is between about 30 and 50 watts, preferably about 40 watts. The power density is usually between about 0.4 and 1.2 watts per $cm^2$ (preferably between about 0.6 and 0.9, especially about 0.75.)

Thickness and refractive indices of the films on silicon substrates are determined ellipsometrically with a Gaertner L116A ellipsometer.

The relative composition and bonding structure of the films is studied by use of a Mattson Instruments, Inc., Cygnus 25 Fourier Transform Infrared Spectrometer (FTIR). Chemical composition information is obtained by Auger Electron Spectroscopy (AES) using a KRATOS XSAM 800 surface analysis system.

Dielectric properties of the films are determined by capacitance-voltage (CV) analysis of metal-insulator-semiconductor (MIS) structures. The aluminum electrodes are 1100 microns in diameter, and CV measurements are performed with the use of a Hewlett Packard automatic CV station at a frequency of 1 MHz.

Hydrogen gas with the cyclic monomer greatly reduces N-H, Si-H and C-H in the deposited film. Hydrogen does abstract —$CH_3$, probably as methane, but it also leaves the film as $H_2$ gas. The resulting film has between about 40–52% of the carbon, probably present as Si-C, and —C-C—. The films obtained are more ceramic-like than organic-like because of these bonds.

Figure 2:
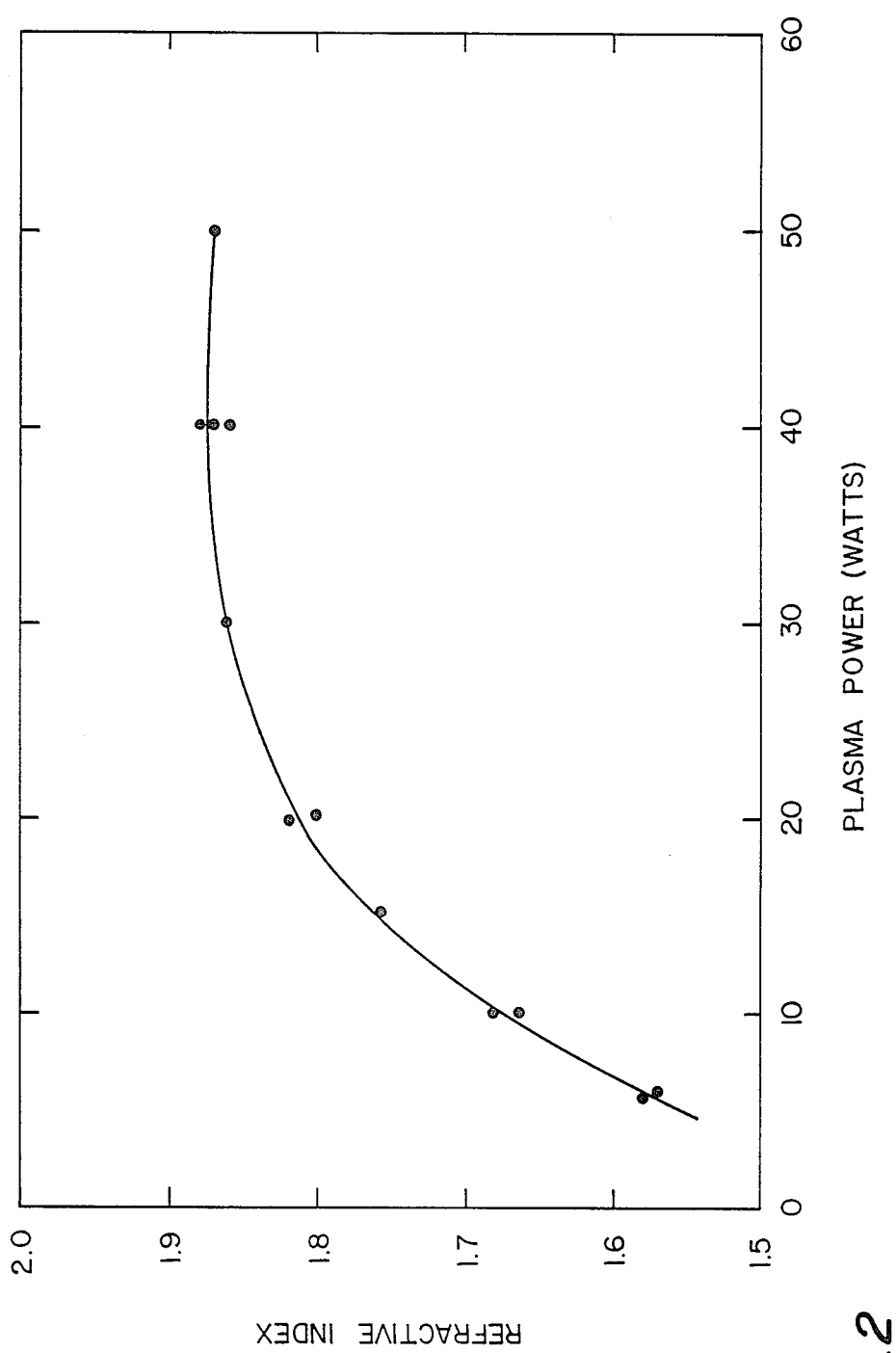

In FIG. 2 is shown the grph of the refractive index versus plasma power for the reaction of cyclic monomer 1,1,3,3,5,5-HMCTSZN (0.2 sccm), with hydrogen (19.8 sccm) at a pressure of 0.3 Torr and temperature of 300° C. The higher refractive index of this film is achieved at higher plasma power. This is interpreted to mean the film is more inorganic (ceramic-like). Higher refractive index films show lower C-H, N-H, and Si-H stretching bands in the infrared spectrum. The film density at 40 W power is about 1.8 g/$cm^3$ indicative of a ceramic-like film structure.

FIG. 3 shows the deposition rate (Angstroms/minute) for the polysilazane film as a function of the RF power. The other conditions are cyclic monomer 0.20 sccm, hydrogen 19.8 sccm, pressure 0.3 Torr and a temperature of 300° C. As the power increases above 30 watts, the deposition rate remains about 30 Angstroms/minutes.

FIG. 4 shows the refractive index of the polysilazane film versus monomer flow rate. T=300° C., P=0.3 Torr, total flow rate of hydrogen and cyclic monomer is 20.0 sccm. To achieve a higher refractive index indicative of an inorganic ceramic-like Si-C and SiN film, a combination of low monomer flow rates and higher RF power is used. A plateau is observed in flow rate (up to 0.40 for 40 W). Better polysilazane films are produced under these conditions.

FIG. 5 is an FTIR spectrum for the polysilazane film produced with cyclic monomer and hydrogen [0.2/19.8 sccm 0.3 Torr 300° C., 40 Watts]. The film is primarily inorganic (or ceramic like). The same spectrum is obtained after the film is exposed to 85° C. saturated water vapor atmosphere for seven days, or periods of about 1 year at 25° C. and about 50% humidity. The polysilazane film shows no signs of oxidation. This behavior is also observed when the film is immmersed in 85° C. water (liquid) for seven days. The polysilazane films are very oxidation resistant. The carbon present is bound in a very stable manner.

FIG. 6 is the FTIR spectrum of the polysilazane film produced at 20 Watts of power (see FIG. 10 for the other experimental conditions). This film has more organic-like character (more C-H, bonds), and is more easily oxidized.

FIG. 7 shows a graph of the deposition rate for the polysilazane film formation as a function of monomer flow rate [monomer, 0.2 sccm, hydrogen, 19.8 sccm, T=300° C., P=0.3 Torr.] Clearly, at 40 W the deposition rate is still continuing to increase whereas at 20 W, a plateau in the rate is observed.

FIG. 8 shows a graph of the deposition rate of the polysilazane films (at its usual) experimental conditions as a function of pressure. The refractive index of the film appears to be independent of deposition pressure.

FIG. 9 shows a graph of the deposition rate of the polysilazane film formed from cyclic monomer and hydrogen (usual experimental conditions, power constant 40 W). The deposition rate drops off as the temperature is increased. The refractive index of the film is generally independent of the deposition temperature.

For the hydrogen gas embodiments, the power is between about 20 and 80 Watts, density 0.37 and 1.5 Watts/$cm^2$ (preferably 30 and 50 watts, about 0.5 to 1.2 watts/$cm^2$).

Films Deposited Using Cyclic Monomer with a Nitrogen Hydrogen Source (HMCTSZN and Ammonia)

In an additional embodiment a silicon nitrogen source, such as 1,1,3,3,5,5-HMCTSZN, is polymerized in ammonia gas, usually without nitrogen or hydrogen being present. Referring to FIG. 1, hydrogen at 23 is replaced with electronic grade ammonia which is introduced in the same manner as is described above for the hydrogen system. It is also possible to use mixtures of ammonia and hydrogen, and ammonia and nitrogen. Optionally, nitrogen at 24 may be added. The other reaction parameters and procedures described above for the hydrogen system are essentially the same for this ammonia system.

The dependence of film deposition rate on monomer flow rate (FIG. 10) shows that even at very low flow rates of HMCTSZN, appre. ciable deposition rates can still be obtained. The linear dependence observed has been noted in the PECVD of other organosilicon monomers. In addition, FIG. 10 indicates that a decrease in HMCTSZN flow rate corresponds to a linear increase in refractive index.

An FTIR of an as.deposited HMCTSZN/$NH_3$ film is shown in FIG. 11 (top). Infrared vibrational assignments are as follows: Si-$CH_3$ (2960 and 1258 $cm^{-1}$), N-H (3350 and 1165 $cm^{-1}$), Si-$NH_2$ (1540 $cm^{-1}$), Si-H (2180 $cm^{-1}$), and Si-N (890 $cm^{-1}$). FTIR spectra of films deposited at decreasing HMCTSZN flow rate (0.7–0.4 sccm) indicate a decrease in the intensity of Si-$CH_3$ vibrations. Such results are consistent with refractive index observations shown in FIG. 10. An Si-$CH_3$ shoulder at 1258 $cm^{-1}$ on the 1165 $cm^{-1}$ N-H peak still exists at 0.4 sccm HMCTSZN, indicating that some carbon is still present in the films, less than about 20 atom percent, preferably less than 10 atom percent, although the concentration is lower than in films produced at 0.7 sccm HMCTSZN. Elimination of visible Si-$CH_3$ stretches occurs when HMCTSZN flow rates reach 0.2 sccm.

After exposure to air for one week (at 27° C., 50 percent relative humidity) the films produced at 0.7 sccm HMCTSZN undergo extensive oxidation and the refractive indices (RI) drop from 1.64 to 1.54. Indeed, aging of plasma polymerized organosilicon films having carbon present is known to occur. In addition, FTIR spectra show a disappearance of the Si-H peak as well as a substantial reduction in both the N-H stretch at 3350 $cm^{-1}$ and the Si-N stretch (FIG. 3). The appearance of a strong peak at 1040 $cm^{-1}$ corresponding to Si-O, and a weak absorption at 1650 $cm^{-1}$, that of a C=O functionality, occur as well. These results demonstrate that as the film ages, nitrogen and hydrogen are liberated, possibly in the form of $NH_3$, as the film essentially converts to silicon dioxide. This observation is also confirmed by AES studies which indicate that little nitrogen remains after air oxidation. Films of SiN produced at 0.4 and 0.2 sccm did not oxidize or age, at least as determined by FTIR spectra recorded up to three months after film deposition.

It appears that the rate at which the film is deposited plays a key role in the ultimate concentration of carbon incorporated in the film. Carbon seems to be primarily present in the form of $CH_3$ substituents attached to silicon atoms in the parent monomer structure. Although previous studies indicate the presence of methylene ($-CH_2-$) groups at 1030 cm$^{-1}$, this absorption ($-CH_2-$) is not observed. Not wishing to be bound by theory, it appears that the linkage of monomer ring structures in the film is believed to be primarily formed by Si-NH-Si bonds. Films deposited at higher deposition rates may not have adequate time for abstraction of methyl ($-CH_3$) substituents from the parent monomer because new film is deposited too quickly over trapped Si-$CH_3$ moieties. Indeed, abstraction of methyl groups by hydrogen radicals generated in the gas phase is believed to occur in the present process. Since the films deposited at higher deposition rates are less dense, due in part to increased hydrogen content and to possible steric effects associated with incorporation of Si-$CH_3$ and Si-$NH_2$ structures, it theoretically should be easier for water vapor or oxygen to penetrate the film structure and oxidize silicon and carbon atoms.

Films which are deposited at 0.2 sccm HMCTSZN and 40 W exhibit a weak dependence of deposition rate on substrate temperature between 150° C. and 400° C. Deposition rates decrease linearly from 5.5 nm/min at 150° C. to 4.1 nm/min at 400° C., while refractive indices vary from 1.69 to 1.81 over the same range of temperatures. Since the films apparently densify with increasing substrate temperature (see FTIR data below), the deposition rate is believed to be independent of temperature, which is in agreement with experimental results observed for $SiN_xH_y$ deposited from $SiH_4$ and $NH_3$. These results can be contrasted to the more standard organosilicon plasma polymerization processes in which far greater temperature effects have been reported.

FTIR analyses of films deposited over this temperature range show a substantial decrease in N-H, $SiNH_2$, and Si-H absorption as temperature increases as shown in FIG. 12. Lowered hydrogen content with increased substrate temperature is consistent with the trend toward higher refractive index as well, since films should densify at elevated temperatures. The spectra of films deposited at 400° C. (FIG. 4 top) closely resemble those of conventional PEGVD $SiN_xH_y$ produced with $SiH_4$ and $NH_3$. Films deposited at 150° C. oxidize substantially after three weeks of air aging, as noted by the disappearance of the Si-H stretch and the appearance of an intense Si-O absorption. Noticeable decreases in the N-H stretch at 3350 cm$^{-1}$ and the Si-N stretch are also observed. This behavior is similar to that of oxidized films formed at higher monomer flowrates and again suggests the possible liberation of $NH_3$. Although no Si-$CH_3$ stretches are detected in the as-deposited film, a carbonyl stretch appears as aging occurs; thus, some carbon is still present. According to FTIR analyses, films of the present invention deposited at temperatures of 200° C. or greater, preferably between about 300° and 400° C., do not change or age. We believe the lack of aging is because the films are initially more dense and contain lower hydrogen and carbon content, preferably less than 20 atom percent, and are therefore not easily penetrated by or reactive to water vapor and oxygen.

RF power has an even greater effect on the chemical composition and structure of bot the ammonia and hydrogen films than does substrate temperature. A pronounced effect of power on the refractive index as seen in FIG. 13 is observed. Films deposited over the range of 20.80 W (preferably 5–35 W) show a nearly linear increase in refractive index with power, but no further change occurs above 35 W. FTIR spectra indicate an increasingly "inorganic" film structure as rf power increases. At power levels below 35 W, a distinct absorption at 1258 cm$^{-1}$ is visible indicating the presence of Si-$CH_3$ groups. However, at 35–50 W, this peak for organic carbon is no longer discernable. A decrease in Si-H, N-H (1165 and 3350 cm$^{-1}$), and $SiNH_2$ peak intensities with increasing power is also observed. Films produced at rf powers below 35 W show aging effects similar to those produced at low temperature (150° C.). Thus, increases in power and temperature have similar effects on film composition and structure. Films contain low carbon and hydrogen concentrations, preferably less than 20 atom percent, especially less than 10 atom percent, are more stable and undergo little, if any, oxidation upon exposure to air. Increased substrate temperature is believed to cause enhanced desorption of organic substituents during film formation as well as increased surface mobility of reactive species, which lead to more thermodynamically stable inorganic structures. In addition to causing more fragmentation of gas phase reactant monomer, elevated rf power may produce similar effects to those of elevated substrate temperature via particle bombardment of the substrate surface. Clearly, temperature increases caused by enhanced surface bombardment of energetic ions is known.

FIG. 13 also illustrates the dependence of deposition rate on plasma power. As the power is increased to 20 W, an increase in deposition rate takes place, while above this value, a nearly constant rate of about 5.2 nm/min is maintained. The increase at the lower values is likely due to the enhanced production of active radicals in both the gas phase and on the surface as more extensive fragmentation of the HMCTSZN molecule takes place due to an increase in the free electron density and electron energy in the plasma. This trend is consistent with previous observations of plasma polymerization.

In the ammonia embodiment, power is about 20.80 Watts (density 0.37 to 1.5 Watts/cm$^2$), preferably about 30.50 Watts (density—about 0.5 to 1.2 Watts/cm$^2$.

Electrical Properties of the Si-N Thin Films from Cyclic Monomer and Hydrogen or Ammonia Electrical characterization of the plasma polymerized (PECVD) films is performed using capacitance voltage (CV) characteristics of a metal/insulator/silicon (MIS) capacitor. For substrate temperatures above 200° C. and rf powers above 25 W, the film dielectric constant is approximately 5.3. Below this power and temperature regime, the dielectric constant fell to values between 4.0 and 4.5. Dielectric constants of PECVD of silane and ammonia films are typically 5.8–8.0.

As plasma power is increased from 25 W to 35 W, a change in the type of electrical instability is found to exist in the films. As shown by the hysteresis directions in FIG. 14, when depositing at powers of 25 W and below, polarization effects dominate, while deposition at 35 W and above leads to instabilities that are related to carrier trapping phenomena at the silicon-insulator interface. Films that contain substantial amounts of carbon typically exhibit polarization since polar sites such as carbonyl or hydroxyl groups readily form from oxidation of trapped carbon and silicon radicals. This explanation is consistent with the presence of Si-O, C=O, and O-H (broadening in the 3400–3600 cm$^{-1}$ range) stretches in the FTIR spectra of films produced at or below 25 W. Conversely, films produced at 35 W and above, which do not show evidence of these IR absorptions, exhibit trapping. This electrical effect is common in conventionally deposited PECVD $SiN_xH_y$. In addition, the transition point in electrical instability type corresponds to the point at which the refractive index no longer changes with increasing rf power (FIG. 13). These results suggest that primarily inorganic silicon nitride.like films with low carbon content, preferably less than 20 atom percent, especially less than 10 atom percent, are produced at power levels of 35 W or above.

The effect of a post.deposition anneal on the CV characteristics of a film deposited at 35 W is illustrated in FIG. 14. The as-deposited film shows trapping along with a negative voltage shift from flat band, indicating the presence of positive charges at the interface. When annealed, CV curves of these films shift to positive voltage and the hysteresis width narrows. In addition, the annealed films show no change in chemical structure from as.deposited films, as evidenced by FTIR spectra. Thus, annealing may alleviate deleterious effects of radiation damage caused by plasma deposition.

The following Examples are to be construed to be only illustrative and exemplary, and are not to be construed as limiting in any way.

The starting materials used are available from commercial sources and are used at the highest purity available, as found in *Chemical Sources*, published annually by Directories Publications, Inc. of Columbia, S.C.

EXAMPLES 1-4

Polysilazane Thin Film Deposition Using Cyclic Monomer and Hydrogen

The following experiments were conducted using the conditions described under the Experimental Details for FIG. 1; 13.56 MHz, P=0.3 Torr, T=300° C., 40 watts, power density 0.75 watts/cm$^2$.

TABLE 1

TESTING RESULTS OF SILICON NITRIDE DEPOSITED AT DIFFERENT FLOW RATE RATIOS
(SiN Formed Using Cyclic Monomer Using Cyclic Monomer and Hydrogen)

| Ex. No. | Flow Rate Ratio (Vol) SiN$^a$/—H$^b$ | Result/Comment |
|---|---|---|
| 1 | less than 0.05/19.95 | Deposition too slow to be practical. |
| 2 | 0.1 to 0.5/ 19.9 to 19.5) | Excellent Si—C—N film layer. High carbon, low hydrogen. |
| 3 | 0.5 to 1.0/ | Si—N film incorporates significant Si—CH$_3$ and Si—CH$_2$. Drastic reduction of useful surface properties within 1 day. |
| 4 | greater than 1.0/19.0 | Unsatisfactory thin film for the proposed uses. More Si—CH$_3$ groups, an organic-like film. Films oxidize in 7 days |

TABLE 1-continued

TESTING RESULTS OF SILICON NITRIDE DEPOSITED AT DIFFERENT FLOW RATE RATIOS
(SiN Formed Using Cyclic Monomer Using Cyclic Monomer and Hydrogen)

| Ex. No. | Flow Rate Ratio (Vol) SiN$^a$/—H$^b$ | Result/Comment |
|---|---|---|
| | | in saturated water environment. |

$^a$HMCTSZN as source
$^b$Hydrogen gas

The amount of carbon in the deposited thin layer of Si-C-N atom percent. In Example 2, about 51 atom percent of carbon is present on an atomic hydrogen free basis. The film has ceramic-like character. The amount of oxygen present is about 4 atom percent. The amount of hydrogen present is about 21%. These values are determined using standard solid state nuclear magnetic resonance and Rutherford back scattering methods.

EXAMPLES 5-11

Thin Layer Deposition from Cyclic Monomer and Ammonia

The following experiments were conducted using the conditions described above under EXPERIMENTAL DETAILS for FIG. 1: 13.56 Mhz, pressure 0.3 torr., temperature 300° C., 40 watts of power density 0.75 wt/cm$^2$.

TABLE 2

TESTING RESULTS OF SILICON NITRIDE DEPOSITED AT DIFFERENT FLOW RATE RATIOS
(Si—N Formed from Cyclic Monomer = Ammonia)

| Ex. No. | Flow Rate Ratio (Vol) SiN$^a$/N—H$^b$ | Result/Comment |
|---|---|---|
| 5 | less than 0.05/19.95 | Deposition too slow |
| 6 | 0.1/19.9 | Satisfactory Si—N layer deposited. |
| 7 | 0.2/19.8 | Excellent Si—N layer deposited. |
| 8 | 0.3/19.7 | Good Si—N layer deposited. |
| 9 | 0.4/19.6 | Acceptable Si—N layer deposited. |
| 10 | 0.7/19.3 | Si—N film deposited incorporates too much O after deposition (C=O). Drastic reduction of useful surface properties within 1 day. |
| 11 | 0.7/19.3 or 0.8/19.2 | Unsatisfactory thin film. Oxidizes extensively after deposition. |

$^a$HMCTSZN as source
$^b$Ammonia as nitrogen-hydrogen source

The amount of carbon in the deposited thin layer of SiN is about 7 atom percent on a hydrogen free basis. The amount of hydrogen present is about 25%. These values are determined using standard solid state nuclear magnetic resonance and Rutherford back scattering methods.

While the present invention has been described with reference to the specific embodiments thereof, it should be understood by those skilled in the art of depositing a ceramic-like silicon nitride as a thin film using plasma enhanced chemical vapor deposition with a cyclic Si-N-C-H monomer and with hydrogen or ammonia at moderate temperatures without the need for a post.deposition pyrolysis as is described herein. The use of PECVD in semiconductor applications is such that various changes may be made and equivalents may be substituted without departing from the true spirit and scope of the present invention. In addition, many modifications may be made to adapt a particular situation, material, or composition of matter, process, process step or steps, or the present objective to the spirit and scope of this invention, without departing from its essential teachings.

We claim:

1. A process for the production of a solid thin film containing silicon and nitrogen on a substrate, said film having a aggregate low concentration of carbon and oxygen of less than about 51 atom percent, which process comprises:
   (A) contacting the substrate with a gaseous mixture substantially in the absence of silane itself comprising:
      (i) a volatile cyclic organic silicon nitrogen source, and
      (ii) hydrogen, under plasma enchanced chemical vapor deposition conditions including a pressure lower than 10 Torr and a temperature greater than ambient temperature for a time sufficient to produce a silicon nitride thin film having ceramic-like properties.

2. The process of claim 1 wherein the organic silicon nitrogen source is selected from compounds consisting of silicon and nitrogen, and optionally carbon and hydrogen.

3. The process of claim 2 wherein the organic silicon nitrogen source is selected from 1,1,3,3,5,5-hexamethylcyclotrisilazane, 1,2,3,4,5,6-hexmethylcyclotrisilazane, 1,1,3,3,5,5,7,7-octamethylcyclotetrasilazane, 1,2,3,4,5,6,7,8-octamethylcyclotetrasilazane, or mixtures thereof.

4. The process of claim 1 wherein the aggregate of the carbon and oxygen present in the deposited thin film is less than about 45 atom percent.

5. The process of claim 1 wherein the plasma enhanced chemical vapor deposition conditions are temperatures of between about 200° and 400° C. and pressures of between about 0.1 and 0.7 Torr.

6. The process of claim 1 wherein the ratio of the organic silicon nitrogen source tohydrogen is between about 0.1/19.9 to 0.7/19.3 by volume.

7. The process of claim 6 wherein the ratio of the volatile cyclic organic silicon nitrogen source (i) to hydrogen (ii) is between about 0.2/19.8 and 0.6/19.4 by volume.

8. The process of claim 7 wherein the ratio is about 0.3/19.7 by volume.

9. A method for depositing a thin surface film comprising silicon nitride on a substrate, which method comprises:
   (a) contacting said substrate with a gaseous mixture substantially in the absence of silane itself comprising:
      (i) a volatile cyclic organic silicon-nitrogen source, and
      (ii) a hydrogen-nitrogen source;
   (b) producing an enhanced plasma discharge in the gaseous mixture under reaction conditions including a pressure lower than 10 Torr and a temperature greater than ambient temperature to produce chemical vapor desposition, and ceramic-like properties on said substrate having an aggregate low concentration of carbon and oxygen of less than about 20 atom percent.

10. The process of claim 9 wherein the hydrogen-nitrogen source is selected from compounds consisting of hydrogen and nitrogen, or of silicon, nitrogen and hydrogen.

11. The process of claim 10 wherein the hydrogen-nitrogen source is selected from hydrogen, nitrogen, ammonia, or mixtures thereof.

12. The method of claim 9, wherein:
   in step (a)(i) the organic silicon nitrogen source is selected from 1,1,3,3,5,5-hexamethylcylotrisilazane, 1,2,3,4,5,6-hexamethylcylotrisilazane, 1,1,3,3,5,5,7,7-octamethylcyclotetrasilazane, 1,2,3,4,5,6,7,8-octamethylcyclotetrasilazane, or mixtures thereof;
   and the ratio of organic silicon nitrogen source to hydrogen nitrogen source is between about 0.1/19.9 and 0.4/19.6 by volume.

13. The process of claim 12 wherein the plasma enhanced chemical vapor deposition conditions are temperatures of between about and 400° C. and pressures of between about 0.1 and 0.7 Torr.

14. The process of claim 13 wherein the temperature is about 300° C. and the pressure is between about 0.2 and 0.4 Torr.

15. The process of claim 13 wherein the ratio of the volatile cyclic organic silicon nitrogen source (i) to the hydrogen nitrogen source (ii) is between about 0.2/19.8 and 0.6/19.4 by volume.

16. The process of claim 15 wherein the ratio is about 0.3/19.7 by volume.

17. The process of claim 1 wherein the plasma enhanced chemical vapor deposition conditions comprise a power between 20 and 80 watts and, a power density of between about 0.37 and 1.5 watts per $cm^2$.

18. The process of claim 1 wherein the plasma is produced using capacitively coupled parallel plate electrodes.

19. The process of claim 1 wherein the plasma is produced using an inductively coupled electrodeless reactor.

20. A substrate having a surface thin film comprising silicon nitride produced by the process of claim 1.

21. A substrate having a surface thin film comprising silicon nitride wherein the silicon nitride thin film is produced by the process of claim 9.

22. A process for the production of a solid thin film containing silicon and nitrogen on a substrate said film having an aggregate low concentration of carbon or oxygen of less than about 51 atom percent, which process comprises:
   (a) contacting the substrate with a gaseous mixture itself consisting essentially of:
      (i) 1,1,3,3,5,5-hexamethylcyclotrisilazane, 1,2,3,4,5,6-hexamethylcyclotrisilazane, or mixtures thereof, and
      (ii) hydrogen, wherein (i) and (ii) are in a ratio of between about 0.1/19.9 and 0.4/19.6 by volume,
   (b) reacting the gaseous mixture in step (a) in an enchaned plasma discharge in the gaseous mixture under reaction conditions to produce chemical vapor deposition on said substrate of a thin film of ceramic-like silicon nitride having an aggregate low concentration of carbon and oxygen of less than 51 atom percent, wherein said conditions comprise temperatures of between about 200° and 400° C., pressures of between about 0.2 and 0.7 Torr and a power of between about 20 and 40 watts, and a power density of between about 0.4 and 1.75 watts per $cm^2$; and (c) recovering the silicon-nitrogen thin film coated substrate having ceramic like character.

23. The process of claim 22 wherein in step (a), the gaseous mixture component (ii) is hydrogen, the ratio of (i) and (ii) is about 0.4/19.6 percent by volume, and;
in step (b) the temperature is about 200° C., the pressure is about 0.3 Torr and the thin film deposited is between about 0.01 and 1 micrometers in thickness.

24. On a substrate, the thin film comprising silicon nitride deposited by the process of claim 9.

25. On a substrate the thin film comprising silicon nitride deposited by the process of claim 22.

26. The process of claim 22 wherein the film has an aggregate low concentration of carbon and oxygen of less than about 40 atom percent.

* * * * *